United States Patent
Radhakrishnan et al.

(10) Patent No.: US 7,790,243 B2
(45) Date of Patent: Sep. 7, 2010

(54) METHOD FOR PRODUCING LARGE-DIAMETER 3D CARBON NANO-ONION STRUCTURES AT ROOM TEMPERATURE

(75) Inventors: Gouri Radhakrishnan, Rancho Palos Verdes, CA (US); Paul M. Adams, Redondo Beach, CA (US); Franklin D. Ross, Anaheim, CA (US)

(73) Assignee: The Aerospace Corporation, El Segundo, CA (US)

( * ) Notice: Subject to any disclaimer, the term of this patent is extended or adjusted under 35 U.S.C. 154(b) by 874 days.

(21) Appl. No.: 11/458,579

(22) Filed: Jul. 19, 2006

(65) Prior Publication Data

US 2010/0068501 A1 Mar. 18, 2010

(51) Int. Cl.
C08F 2/46 (2006.01)
C08F 2/54 (2006.01)

(52) U.S. Cl. .................. 427/496; 423/445 R; 977/844; 977/901

(58) Field of Classification Search ................ 427/496; 423/445 R; 977/844, 901
See application file for complete search history.

(56) References Cited

U.S. PATENT DOCUMENTS

| | | |
|---|---|---|
| 4,704,302 A | 11/1987 | Bruel et al. |
| 6,361,861 B2 | 3/2002 | Gao et al. |
| 6,599,492 B2 * | 7/2003 | Iwamura et al. ......... 423/445 B |
| 6,683,783 B1 | 1/2004 | Smalley et al. |
| 6,692,718 B1 * | 2/2004 | Osawa .................... 423/448 |
| 6,749,827 B2 | 6/2004 | Smalley et al. |
| 6,936,233 B2 | 8/2005 | Smalley et al. |
| 6,949,237 B2 | 9/2005 | Smalley et al. |
| 6,979,709 B2 | 12/2005 | Smalley et al. |
| 6,986,876 B2 | 1/2006 | Smalley et al. |
| 2002/0085968 A1 | 7/2002 | Smalley et al. |
| 2002/0094311 A1 | 7/2002 | Smalley et al. |
| 2002/0098135 A1 | 7/2002 | Smalley et al. |
| 2002/0102196 A1 | 8/2002 | Smalley et al. |
| 2002/0136681 A1 | 9/2002 | Smalley et al. |
| 2002/0150524 A1 | 10/2002 | Smalley et al. |
| 2002/0159943 A1 | 10/2002 | Smalley et al. |
| 2003/0141179 A1 | 7/2003 | Yu et al. |
| 2004/0076576 A1 | 4/2004 | Lee et al. |
| 2004/0110005 A1 | 6/2004 | Choi et al. |
| 2005/0037255 A1 | 2/2005 | Ozaki et al. |
| 2005/0249656 A1 | 11/2005 | Smalley et al. |

(Continued)

FOREIGN PATENT DOCUMENTS

WO  WO 2005023708 A2 *  3/2005

OTHER PUBLICATIONS

Iijima, S., "Direct Observation of the Tetrahedral Bonding in Graphitized Carbon Black by High Resolution Electron Microscopy," *Journal of Crystal Growth*, vol. 50 (1980), pp. 675-683.

(Continued)

*Primary Examiner*—Roberts Culbert
(74) *Attorney, Agent, or Firm*—Henricks, Slavin & Holmes LLP

(57) ABSTRACT

A method includes imparting energy to a target in an oxygen-containing atmosphere at room temperature to provide a substrate facing the target with a carbonaceous coating that includes nested carbon structures.

58 Claims, 5 Drawing Sheets

U.S. PATENT DOCUMENTS

2005/0260120 A1 11/2005 Smalley et al.
2006/0008408 A1 1/2006 Ho Yoon et al.

OTHER PUBLICATIONS

Kroto, H. W.; Heath, J. R.; O'Brien, S. C.; Curl, R. F.; Smalley, R. E., "$C_{60}$: Buckminsterfullerene," Nature (London), vol. 318, No. 14 (Nov. 14, 1985), pp. 162-163.

Iijima, S., "The 60-Carbon Cluster Has Been Revealed!" Journal of Physical Chemistry, vol. 91 (1987), pp. 3466-3467.

Kroto, H. W.; McKay, K., "The Formation of Quasi-Icosahedral Sprial Shell Carbon Particles," Nature (London), vol. 331, No. 28 (Jan. 28, 1988), pp. 328-331.

Iijima, S., "Helical Microtubes of Graphitic Carbon," Nature (London), vol. 354 (Nov. 7, 1991), pp. 56-58.

Kroto, H. W., "Carbon Onions Introduce New Flavour to Fullerene Studies," Nature (London), vol. 359 (Oct. 22, 1992), pp. 670-671.

Ugarte, D., "Curling and Closure of Graphitic Networks Under Electron-Beam Irradiation," Nature (London), vol. 359 (Oct. 22, 1992), pp. 707-709.

Geohegan, D. B.; Puretzky, A. A., "Dynamics of Laser Ablation Plume Penetration Through Low Pressure Background Gases," Applied Physics Letters, vol. 67, No. 2 (Jul. 10, 1995), pp. 197-199.

Iijima, S.; Wakabayashi, T.; Achiba, Y., "Structures of Carbon Soot Prepared by Laser Ablation," Journal of Physical Chemistry, vol. 100 (Published on Web: Apr. 4, 1996), pp. 5839-5843.

Banhart, F.; Ajayan, P. M., "Carbon Onions as Nanoscopic Pressure Cells for Diamond Formation," Nature (London), vol. 382 (Aug. 1, 1996), pp. 433-435.

Yudasaka, M.; Komatsu, T.; Ichihashi, T.; Achiba, Y.; Iijima, S., "Pressure Dependence of the Structures of Carbonaceous Deposits Formed by Laser Ablation on Targets Composed of Carbon, Nickel, and Cobalt," Journal of Physical Chemistry, vol. 102 (Published on Web: Jun. 5, 1998), pp. 4892-4896.

Hafner, J. H.; Bronikowski, M. J.; Azamian, B. R.; Nikolaev, P.; Rinzler, A. G.; Colbert, D. T.; Smith, K. A.; Smalley, R. E., "Catalytic Growth of Single-Wall Carbon Nanotubes From Metal Particles," Chemical Physics Letters, vol. 296 (Oct. 30, 1998), pp. 195-202.

Kokai, F.; Takahashi, K.; Yudasaka, M.; Yamada, R.; Ichihashi, T.; Iijima, S., "Growth Dynamics of Single-Wall Carbon Nanotubes Synthesized by $CO_2$ Laser Vaporization," Journal of Physical Chemistry B, vol. 103 (Published on Web: Jun. 8, 1999), pp. 4346-4351.

Iijima, S.; Yudasaka, M.; Yamada, R.; Bandow, S.; Suenaga, K.; Kokai, F.; Takahashi, K., "Nano-Aggregates of Single-Walled Graphitic Carbon Nano-Horns," Chemical Physics Letters, vol. 309 (Aug. 13, 1999), pp. 165-170.

Nikolaev, P.; Bronikowski, M. J.; Bradley, R. K.; Rohmund, F.; Colbert, D. T.; Smith, K. A.; Smalley, R. E., "Gas-Phase Catalytic Growth of Single-Wall Carbon Nanotubes From Carbon Monoxide," Chemical Physics Letters, vol. 313 (Nov. 5, 1999), pp. 91-97.

Arepalli, S.; Nikolaev, P.; Holmes, W.; Scott, C. D., "Diagnostics of Laser-Produced Plume Under Carbon Nanotube Growth Conditions," Applied Physics A, vol. 69 (Jan. 6, 2000), pp. 1-9.

Puretzky, A. A.; Geohegan, D. B.; Fan, X.; Pennycook, S. J., "In Situ Imaging and Spectroscopy of Single-Wall Carbon Nanotube Synthesis by Laser Vaporization," Applied Physics Letters, vol. 76, No. 2 (Jan. 10, 2000), pp. 182-184.

Puretzky, A. A.; Geohegan, D. B.; Fan, X.; Pennycook, S. J., "Dynamics of Single-Wall Carbon Nanotube Synthesis by Laser Vaporization," Applied Physics A, vol. 70 (Published online: Jan. 21, 2000), pp. 153-160.

Smith, B. W.; Luzzi, D. E., "Formation Mechanism of Fullerene Peapods and Coaxial Tubes: a Path to Large Scale Synthesis," Chemical Physics Letters, vol. 321 (Apr. 21, 2000), pp. 169-174.

Yu, M.; Files, B. S.; Arepalli, S.; Ruoff, R. S., "Tensile Loading of Ropes of Single Wall Carbon Nanotubes and their Mechanical Properties," Physical Review Letters, vol. 84, No. 24 (Jun. 12, 2000), pp. 5552-5555.

Arepalli, S.; Nikolaev, P.; Holmes, W.; Files, B. S., "Production and Measurement of Individual Single-Wall Nanotubes and Small Ropes of Carbon," Applied Physics Letters, vol. 78, No. 10 (Mar. 5, 2001), pp. 1-3.

Sano, N.; Wang, H.; Chhowalla, M.; Alexandrou, I.; Amaratunga, G. A. J., "Synthesis of Carbon 'Onions' in Water," Nature(London), vol. 414 (Nov. 29, 2001), pp. 506-507.

Yudasaka, M.; Kasuya, Y.; Kokai, F.; Takahashi, K.; Takizawa, M.; Bandow, S.; Iijima, S., "Causes of Different Catalytic Activities of Metals in Formation of Single-Wall Carbon Nanotubes," Applied Physics A, vol. 74 (Published online: Jan. 23, 2002), pp. 377-385.

Braidy, N.; El Khakani, M. A.; Botton, G. A., "Single-Wall Carbon Nanotubes Synthesis by Means of UV Laser Vaporization," Chemical Physics Letters, vol. 354 (Mar. 5, 2002), pp. 88-92.

Puretzky, A. A.; Schittenhelm, H.; Fan, X.; Lance, M. J.; Allard Jr., L. F.; Geohegan, D. B., "Investigations of Single-Wall Carbon Nanotube Growth by Time-Restricted Laser Vaporization," Physical Review B, vol. 65 (Jun. 24, 2002), pp. 245425-1-245425-9.

Sano, N.; Wang, H.; Alexandrou, I.; Chhowalla, M.; Teo, K. B. K.; Amaratunga, G. A. J., "Properties of Carbon Onions Produced by an Arc Discharge in Water," Journal of Applied Physics, vol. 92, No. 5 (Sep. 1, 2002), pp. 2783-2788.

Iijima, S., "Carbon Nanotubes: Past, Present, and Future," Physica B, vol. 323 (Oct. 2002), pp. 1-5.

Chhowalla, M.; Wang, H.; Sano, N.; Teo, K. B. K.; Lee, S. B.; Amaratunga, G. A. J., "Carbon Onions: Carriers of the 217.5 nm Interstellar Absorption Feature," Physical Review Letters, vol. 90, No. 15 (Apr. 16, 2003), pp. 155504-1-155504-4.

Geohegan, D. B.; Puretzky, A. A.; Ivanov, I. N.; Jesse, N.; Eres, G.; Howe, J. Y., "In Situ Growth Rate Measurements and Length Control During Chemical Vapor Deposition of Vertically Aligned Multiwall Carbon Nanotubes," Applied Physics Letters, vol. 83, No. 9 (Sep. 1, 2003), pp. 1851-1853.

Chen, F.; Xue, Y.; Hadjiev, V. G.; Chu, C. W.; Nikolaev, P.; Arepalli, S., "Fast Characterization of Magnetic Impurities in Single-Walled Carbon Nanotubes," Applied Physics Letters, vol. 83, No. 22 (Dec. 1, 2003), pp. 4601-4603.

Rümmeli, M. H.; Borowiak-Palen, E.; Gemming, T.; Pichler, T.; Knupfer, M.; Kalbác, M.; Dunsch, L.; Jost, O.; Silva, S. R. P.; Pompe, W.; Büchner, B., "Novel Catalysts, Room Temperature, and the Importance of Oxygen for the Synthesis of Single-Walled Carbon Nanotubes," Nano Letters, vol. 5, No. 7 (Web Release Date: May 27, 2005), pp. 1209-1215.

Iijima, S.; Ichihashi, T., "Single-shell carbon nanotubes of 1-nm diameter," Nature (London), vol. 363 (Jun. 17, 1993), pp. 603-605.

Guo, T.; Nikolaev, P.; Rinzler, A. G.; Tomanek, D.; Colbert, D. T.; Smalley, R. E., "Self-assembly of tubular fullerenes," Journal of Physical Chemistry, vol. 99, No. 27 (1995), pp. 10694-10697.

Guo, T.; Nikolaev, P.; Thess, A.; Colbert, D. T.; Smalley, R. E., "Catalytic growth of SWNT by laser vaporization," Chemical Physics Letters, vol. 243 (Sep. 8, 1995), pp. 49-54.

Yudasaka, M.; Komatsu, T.; Ichihashi, T.; Iijima, S., "Single-wall carbon nanotube formation by laser ablation using double-targets of carbon and metal," Chemical Physics Letters, vol. 278, Issues 1-3 (Oct. 24, 1997), pp. 102-106.

Suzuki, S.; Bower, C.; Zhou, O., "In-situ TEM and EEIS studies of alkali-metal intercalation with single-walled carbon nanotubes," Chemical Physics Letters, vol. 285 (Mar. 20, 1998), pp. 230-234.

Yu, D. P.; Sun, X. S.; Lee, C. S.; Bello, I.; Lee, S. T.; Gu, H. D.; Leung, K. M.; Zhou, G. W.; Dong, Z. F.; Zhang, Z., "Synthesis of boron nitride nanotubes by means of excimer laser ablation at high temperature," Applied Physics Letters, vol. 72, No. 16 (Apr. 20, 1998), pp. 1966-1968.

Choi, W. B.; Chung, D. S.; Kang, J. H.; Kim, H. Y.; Jin, Y. W.; Han, I. T.; Lee, Y. H.; Jung, J. E.; Lee, N. S.; Park, G. S.; Kim, J. M., "Fully sealed, high-brightness carbon-nanotube field emission display," Applied Physics Letters, vol. 75, No. 20 (Nov. 15, 1999), pp. 3129-3131.

Zhang, M.; Yudasaka, M.; Iijima, S., "Single-wall carbon nanotubes: a high yield of tubes through laser ablation of a crude-tube target," Chemical Physics Letters, vol. 336 (Mar. 16, 2001), pp. 196-200.

Scott, C. D.; Arepalli, S.; Nikolaev, P.; Smalley, R. E., "Growth mechanisms for single-wall carbon nanotubes in a laser-ablation process," *Applied Physics A*, vol. 72 (Published online: Mar. 23, 2001), 573-580.

Chen, Yan; Shaw, David T.; Bai, X. D.; Wang, E. G.; Lund, C.; Lu, W. M.; Chung, D. D. L., "Hydrogen storage in aligned carbon nanotubes," *Applied Physics Letters*, vol. 78, No. 15 (Apr. 9, 2001), pp. 2128-2130.

Kokai, F.; Takahashi, K.; Kasuya, D.; Yudasaka, M.; Iijima, S., "Growth of single-wall carbon nanotubes dependent on laser power density and ambient gas pressure during room-temperature CO2 laser vaporization," *Applied Physics A*, vol. 73 (Published online: Aug. 30, 2003), pp. 401-407.

Suizu, K.; Nagayama, K., "High-velocity carbon plume generated by Nd:YAG laser for thin crabon film deposition," *Japanese Journal of Applied Physics*, vol. 41 (Feb. 2002), pp. 636-640.

Murakami, Y.; Miyauchi, Y.; Chiashi, S.; Maruyama, S., "Direct synthesis of high-quality single-walled carbon nanotubes on silicon and quartz substrates," *Chemical Physics Letters*, vol. 377 (Published online: Jul. 22, 2003), pp. 49-54.

Zhang, M.; Yudasaka, M.; Iijima, S., "Production of large-diameter single-wall carbon nanotubes by adding Fe to a NiCo catalyst in laser ablation, " *Journal of Physical Chemistry B*, vol. 108 (Published on Web: Jul. 28, 2004), pp. 12757-12762.

Radhakrishnan, G.; Adams, P.M.; Bernstein, L.S., "Plasma characterization and room temperature growth of carbon nanotubes and nano-onions by excimer laser ablation," *Applied Surface Science*, vol. 253 (Available online: Feb. 20, 2007), pp. 7651-7655.

Radhakrishnan et al., U.S. Appl. No. 11/458,597, filed on Jul. 19, 2006 (complete file history through Response after Non-Final Action on May 18, 2010).

* cited by examiner

METHOD FOR PRODUCING LARGE-DIAMETER 3D CARBON NANO-ONION STRUCTURES AT ROOM TEMPERATURE

TECHNICAL FIELD

The invention relates generally to a method of providing a carbonaceous material and, in particular, to a method of providing a substrate with a carbonaceous coating that includes nested carbon structures.

BACKGROUND ART

There has been a tremendous interest in carbon nanoparticles since the discovery of the carbon nanotube in a high-temperature arc. Concentric shell structures, 3-7 nm in diameter, have been observed in small, spherical particles of graphitized carbon deposited during the evaporation of carbon by arc discharge in vacuum.

It has been reported that when irradiating carbon soot, collected from an arc-discharge apparatus, in a 300 KV-transmission electron microscope (TEM), with an electron dose 10-20 times higher than under normal operating conditions, the originally tubular or polyhedral graphite particles start becoming spherical after 10 minutes of irradiation, and eventually completely transformed into a quasi-spherical morphology. It was further reported that the particles were composed of an assembly of concentric spherical graphitic cages with the distance between layers being that of bulk graphite (0.34 nm). The assembly of spherical shells obtained were on the order of 47 nm in size. Additionally, it has also been shown that electron irradiation at 700° C. could also anneal out defects resulting in spherical shells with a decreasing spacing towards the center of the onion.

More recently, a dc arc discharge employed in de-ionized water between two carbon electrodes produced nested onion-like carbon nanoparticles with diameters of 4-36 nm. In addition to spherical nano-onions, elongated structures have been reported. Other carbon structures have also been observed both in Nd:YAG laser ablation and $CO_2$ laser ablation of graphite rods. These include nanohorns. Nearly spherical particles about 80 nm in diameter were observed and individual particles showed aggregates of horn-shaped sheaths of single-walled graphene sheets in high resolution. Carbon nanotubular structures have been observed using KrF laser irradiation of a graphite pellet at 248 nm at 1150° C. and high argon gas pressure (500 Torr).

It would be useful to be able to provide carbon nanostructures without having to employ a high temperature process. It would be useful to be able to use an excimer laser to provide carbon nanostructures without having to employ a high temperature process. It would be useful to be able to provide larger sized carbon nanostructures than those produced by presently known techniques.

SUMMARY OF THE INVENTION

Example embodiments of the present invention involve depositing graphitic nano-onion structures in an ambient of $O_2$ at room temperature, by pulsed laser ablation of metal-doped graphite targets and targets of graphite filled organic compounds. For comparison, ablation of pure graphite targets is also discussed. In an example embodiment, nano-onion structures are produced in the presence of $O_2$ gas at pressures greater than 0.1 Torr, but not in Ar atmospheres with comparable pressures. The resulting structures were observed to be 100-200 nm in diameter, significantly larger than nano-onions produced by arc discharge and electron irradiation. Time-resolved emission spectroscopy was employed to examine differences between evolving plume species under various conditions. The shell structure of these nano-onions makes them good candidates for trapping small molecules. Large 3D cages can serve as an excellent catalyst, again by trapping or adsorbing molecules on surfaces or within the cage. Potential applications for the structures described herein include, but are not limited to, energy storage, electrochemical applications, e.g., thin-film batteries and microbatteries, and nano-sensors, e.g., gas sensors, protein, and DNA sensors.

In an example embodiment, a method includes employing a laser process in an oxygen-containing atmosphere at room temperature to provide a substrate with a carbonaceous coating that includes nested carbon structures. In an example embodiment, the substrate is insulating. In an example embodiment, the substrate is conductive. By way of example, the substrate can include one or more of the following: a polymer, Silicon (Si), glass, quartz, Indium Tin Oxide (ITO), and metal (e.g., steel). In an example embodiment, the laser process includes laser ablation of a target facing the substrate. By way of example, the target can include one or more of the following: graphite, a graphite filled organic compound, graphite cement, metal-doped graphite (e.g., Ni-doped graphite, or Ni-Co-doped graphite). In an example embodiment, employing the laser process includes using an excimer laser. In an example embodiment, employing the laser process includes using a KrF laser. In an example embodiment, the oxygen-containing atmosphere is at a pressure of approximately 0.1 Torr or greater. In an example embodiment, the oxygen-containing atmosphere is at a pressure of approximately 2 Torr. In an example embodiment, the carbonaceous coating is low friction. In an example embodiment, the nested carbon structures are onion-shaped. In an example embodiment, the nested carbon structures have outer diameters of approximately 100-200 nm. In an example embodiment, the nested carbon structures have outer diameters of approximately 200 nm. In an example embodiment, the nested carbon structures include substantially concentric layers. In an example embodiment, the nested carbon structures include five or more layers. In an example embodiment, the nested carbon structures each include layers formed about a core. In an example embodiment, the cores include fullerene.

In an example embodiment, a method includes imparting energy to a target in an oxygen-containing atmosphere at room temperature to provide a substrate facing the target with a carbonaceous coating that includes nested carbon structures. By way of example, the target can include one or more of the following: graphite, a graphite filled organic compound, graphite cement, metal-doped graphite (e.g., Ni-doped graphite, or Ni-Co-doped graphite). In an example embodiment, the substrate is insulating. In an example embodiment, the substrate is conductive. By way of example, the substrate can include one or more of the following: a polymer, Silicon (Si), glass, quartz, Indium Tin oxide (ITO), and metal (e.g., steel). In an example embodiment, imparting energy includes using a laser to ablate the target. In an example embodiment, imparting energy includes using an excimer laser to ablate the target. In an example embodiment, imparting energy includes using a KrF laser to ablate the target. In an example embodiment, the oxygen-containing atmosphere is at a pressure of approximately 0.1 Torr or greater. In an example embodiment, the oxygen-containing atmosphere is at a pressure of approximately 2 Torr. In an example embodiment, the carbonaceous coating is low friction. In an example embodiment, the nested carbon structures are onion-shaped. In an example embodiment, the nested carbon structures have outer diameters of approximately 100-200 nm. In an example embodiment, the nested carbon structures have outer diameters of approximately 200 nm. In an example embodiment, the nested carbon structures include substantially concentric layers. In an example embodiment, the nested carbon structures include five or more layers. In an example embodiment, the nested carbon structures each include layers formed about a core. In an example embodiment, the cores include fullerene.

In an example embodiment, an electrode structure includes a substrate, and a carbonaceous coating over the substrate, the carbonaceous coating including nested carbon structures that have outer diameters of 100 nm or greater. In an example embodiment, the substrate is insulating. In an example embodiment, the substrate is conductive. By way of example, the substrate can include one or more of the following: a polymer, Silicon (Si), glass, quartz, Indium Tin oxide (ITO), and metal (e.g., steel). In an example embodiment, the carbonaceous coating is low friction. In an example embodiment, the nested carbon structures are onion-shaped. In an example embodiment, the nested carbon structures include substantially concentric layers. In an example embodiment, the nested carbon structures include five or more layers. In an example embodiment, the nested carbon structures each include layers formed about a core. In an example embodiment, the cores include fullerene.

DISCLOSURE OF INVENTION

Figure 1:
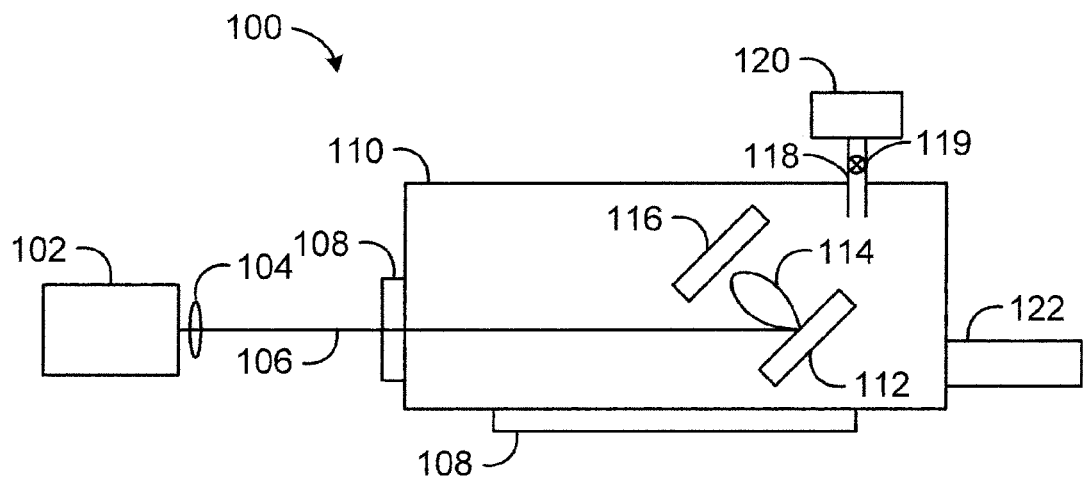
FIG. 1 illustrates an example embodiment of a system for providing nanostructures according to the methods described herein.

Referring to FIG. 1, in an example embodiment, a system 100 for providing nanostructures according to the methods described herein includes a laser 102 (e.g., an excimer laser) and a lens 104 which focuses laser beam 106. The laser 102 is configured to direct the laser beam 106 through a window 108 of chamber 110 (e.g., a high vacuum chamber) toward a target 112. The energy imparted by the laser beam 106 results in an ablation plume 114. A substrate 116 is positioned within the chamber 110 to face the target 112 so that the ablation plume 114 is incident upon the target 112. A gas inlet 118 via needle valve 119 from gas source 120 and one or more pumps 122 are also provided.

Figure 2:
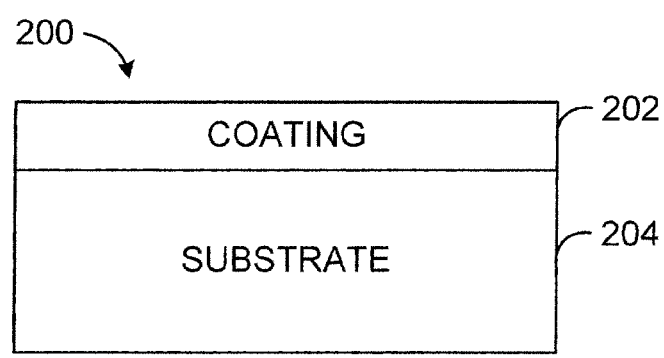
FIG. 2 illustrates an example embodiment of a substrate/depositant structure provided according to the methods described herein.

Referring to FIG. 2, the methods described herein can be used to provide a substrate/depositant structure 200 that includes a substrate 204 coated with a carbonaceous coating 202 (or coating). In an example embodiment, the carbonaceous coating 202 includes nested carbon structures. In an example embodiment, the carbonaceous coating 202 is low friction.

In an example embodiment, the nested carbon structures are onion-shaped. In an example embodiment, the nested carbon structures have outer diameters of approximately 100-200 nm. In an example embodiment, the nested carbon structures have outer diameters of approximately 200 nm. In an example embodiment, the nested carbon structures include substantially concentric layers. In an example embodiment, the nested carbon structures include five or more layers. In an example embodiment, the nested carbon structures each include layers formed about a core. In an example embodiment, the cores include fullerene.

In an example embodiment, the laser 102 is a KrF laser (e.g., Lambda Physik 210 I, 248 nm). Other wavelengths such as 193 nm, 532 nm, 1.06 μm, 355 nm, can also be used. It is also contemplated that energy can be imparted to the target 112 with techniques other than laser ablation.

The target 112 can include one or more of the following: graphite, a graphite filled organic compound, graphite cement, metal-doped graphite (e.g., Ni-doped graphite, or Ni-Co-doped graphite). It is contemplated that other metals can be used, such as Fe, Co, Gd, B, Pt and Pd and/or mixtures of these. It is believed that a metal-free target such as from an organic aromatic compound can also be used.

In an example embodiment, the substrate 116 is insulating. In an example embodiment, the substrate 116 is conductive. The substrate 116 can include one or more of the following: a polymer, Silicon (Si), glass, quartz, Indium Tin Oxide (ITO), and metal (e.g., steel). In an example embodiment, the distance between the target 112 and the substrate 116 is between 0.5 inch and 6 inches.

In an example embodiment, the gas source 120 provides an oxygen-containing atmosphere within the chamber 110 at a pressure of approximately 0.1 Torr or greater controlled by the needle valve 119 and one or more pumps 122. In an example embodiment, the oxygen-containing atmosphere is at a pressure of approximately 2 Torr. It is believed that other ambients such as $N_2$, $H_2$, $H_2O$, NO etc. are also potential candidates.

In example embodiments, the carbonaceous coating 202 is provided by deposition of graphitic nano-onion structures in an ambient of $O_2$ at room temperature, by the pulsed laser ablation of a Ni-doped or Ni-Co-doped graphite target at 248 nm. For comparison, ablation of pure graphite targets is also discussed. The carbonaceous coating produced includes nano-onion structures with an overall diameter of 100-200 nm, which is significantly larger than prior spherical shell structures reported. Time-resolved emission spectroscopy was employed to examine differences between evolving plume species under various conditions.

In example embodiments, commercially available pure graphite targets (99.999%, 1.000 inch diameter) and composite Ni-doped and Ni-Co-doped graphite targets were used for laser ablation. The graphite-Ni targets (1.000 inch diameter, 1% Ni) were prepared by pressing a mixture of graphite powder (99.9999%, −200 mesh), a commercially available graphite cement (e.g., Dylan GC Graphite Cement), in a 1:1 ratio by weight, which serves as a binder and Ni powder (99.996%, −120 mesh) at 15 KPsi at 130° C. for 4 h, followed by annealing in flowing Ar at 450° C. for 8 h, or 800° C. for 8 h, followed by 1100° C. for 12 h. Graphite cement targets were prepared by the same procedure, using only a weighed amount of Dylon cement. The targets were irradiated with a KrF laser (Lambda Physik 210 I, 248 nm), with a pulse width of 25 ns. A laser intensity of $8\times10^8$ W/cm$^2$ was used. The pressures of $O_2$ and Ar gases were controlled with a needle valve. Gas pressures of 2 Torr were employed. The substrates were held 4" in front of the target surface. Ablation products were deposited on Si substrates as well as holey carbon TEM grids. TEM was performed with a Hitachi H-9000 electron microscope at 300 KV. The best TEM samples were prepared by wiping a holey carbon grid across the Si substrate. Emission spectra of the plume were recorded with a gated, intensified, air-cooled ICCD detector (PI Max, 1024×256) mounted on the exit port of a 320I-f/4 spectrometer equipped with 3 gratings having 300 gr/mm blazed at 500 nm, 600 gr/mm blazed at 400 nm, and a holographic 2400 gr/mm for the UV. The ICCD was gatable to 4 ns and was triggered by the excimer laser.

Figure 3A:
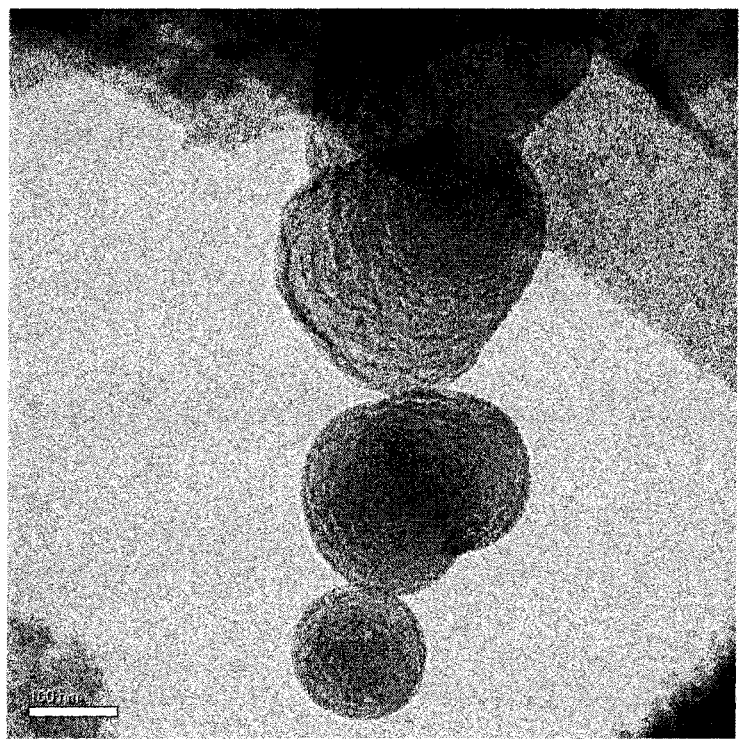
FIG. 3A is a Transmission Electron Microscopy (TEM) image of individual nano-onion structures provided according to the methods described herein.
Figure 3B:
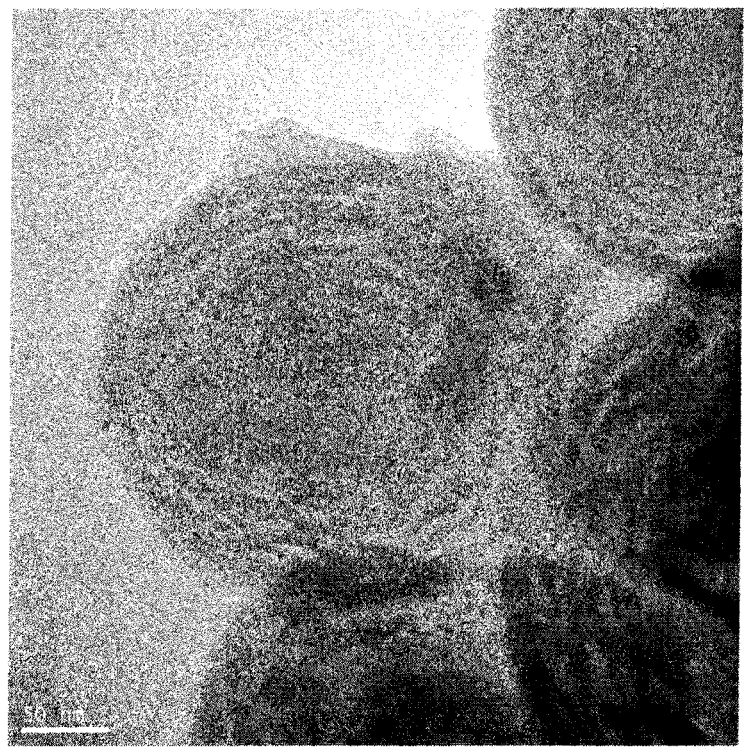
FIG. 3B is a TEM image of clustered nano-onion structures provided according to the methods described herein.
Figure 3C:
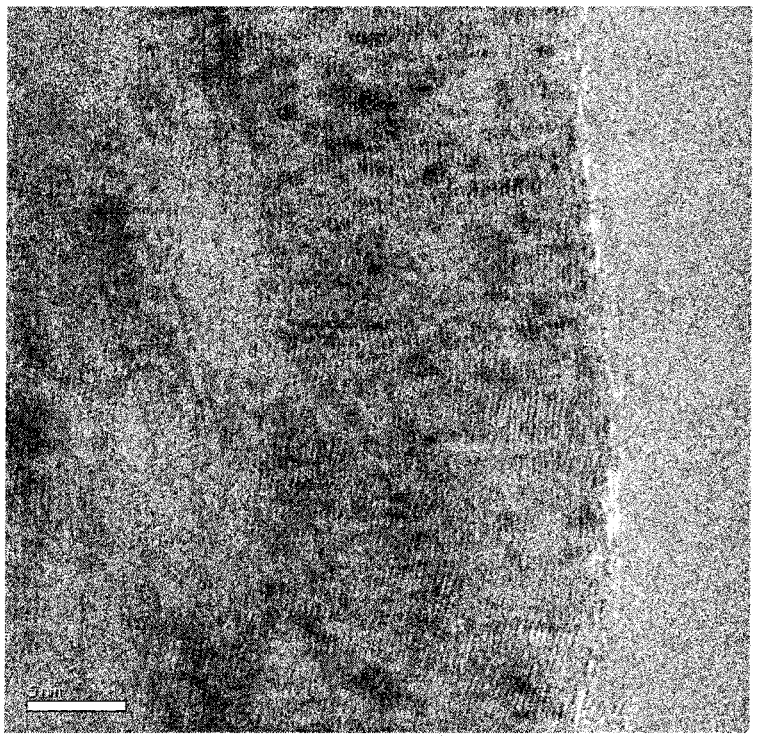
FIG. 3C is a high-resolution TEM image showing lattice fringes, which match the (002) lattice planes in graphite.
Figure 3D:
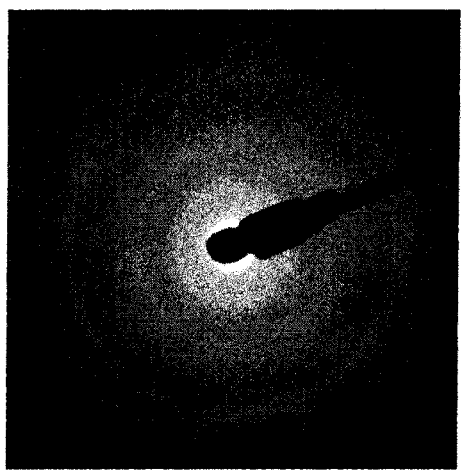
FIG. 3D is a Selected Area Electron Diffraction (SAED) pattern with inner ring corresponding to the (002) reflection in graphite.
Figure 3E:
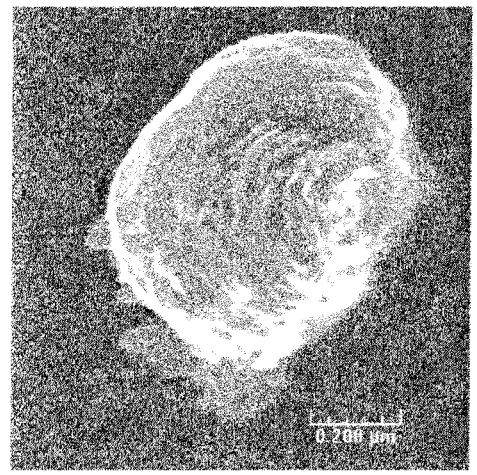
FIG. 3E is a Scanning Electron Microscope (SEM) image showing the internal layer structure of a broken nano-onion.

TEM analyses show that the materials deposited from ablating a graphite-metal target at 2 Torr $O_2$ and 2 Torr Ar are very different from each other. Nano-onion structures are observed from a graphite-Ni target with 2 Torr $O_2$. The formation of such onion-like nanostructures using excimer laser ablation at room temperature has not been reported previously. The production of these nano-onion structures was readily observed in $O_2$ atmospheres of 0.1 Torr and greater. The TEM images of these structures (FIGS. 3A and 3B) reveal that they are seen as individual onions or clustered onions and have diameters of 100-200 nm. Individual strands of 5-10 nm can also be observed. High resolution TEM (FIG. 3C) shows continuous (002) lattice fringes in the onion structure, which correspond to graphitic planes. The corresponding selected area electron diffraction (SAED) pattern is shown in FIG. 3D. The lattice spacing measured from structures in 3 different samples is found to be 0.340±0.005 nm, which corresponds to (002) lattice planes in graphite. The three-dimensional nested structure of nano-onions can be seen in the SEM image (FIG. 3E) of a broken onion.

Structures that are observed in the TEM range from tightly wound and spherical to more extended and disorganized with open space. At first glance the TEM images appear to resemble filaments that are wound up.

Onion structures generated by the methods described herein have been observed under normal operating conditions in the TEM without any in-situ transformations during irradiation, hence ruling out the possibility of them being produced by electron beam irradiation.

Figure 4A:
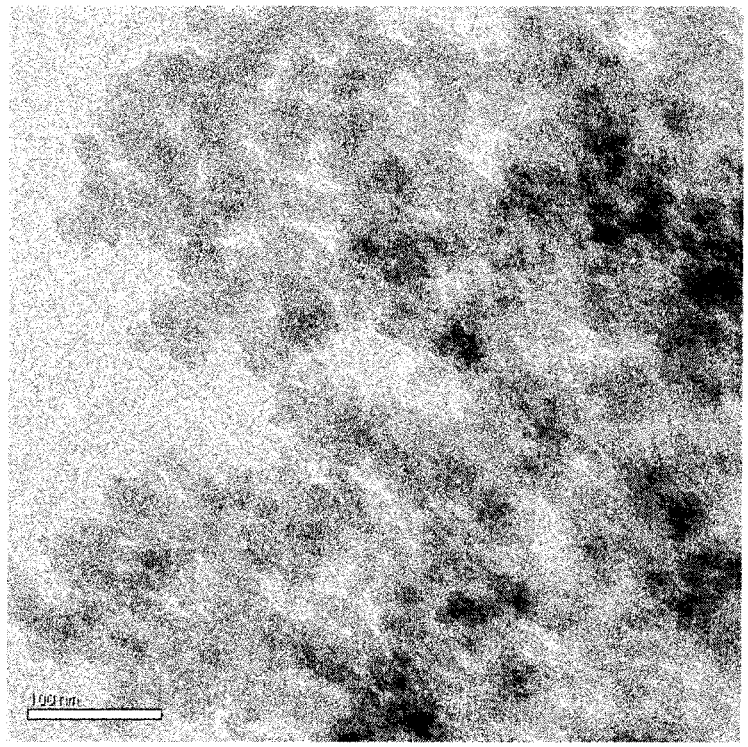
FIG. 4A is a TEM image of material deposited in 2 Torr Ar.
Figure 4B:
FIG. 4B is a SAED pattern corresponding to FIG. 4A.
Figure 5A:
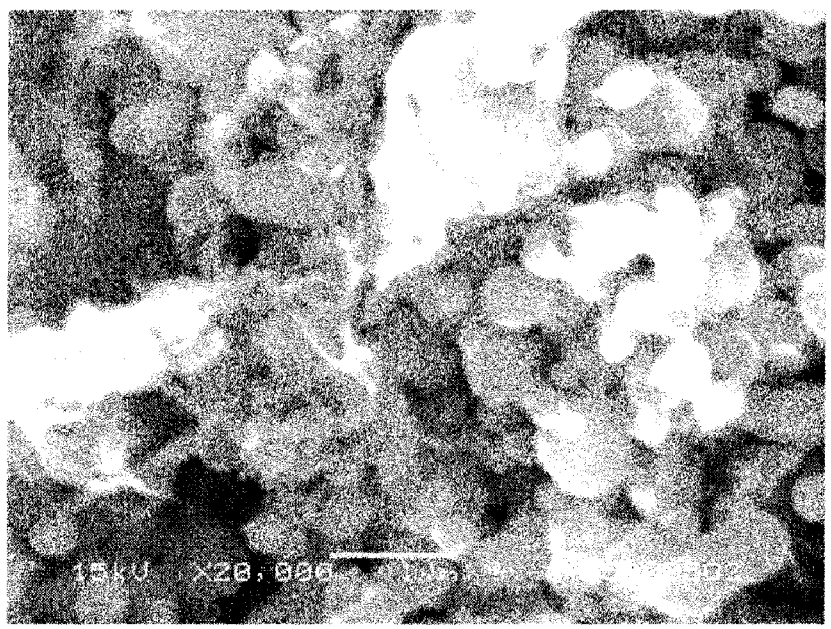
FIG. 5A is a SEM image of material deposited by ablation of graphite-filled phenolic target in 2 Torr $O_2$ according to an example method described herein.
Figure 5B:
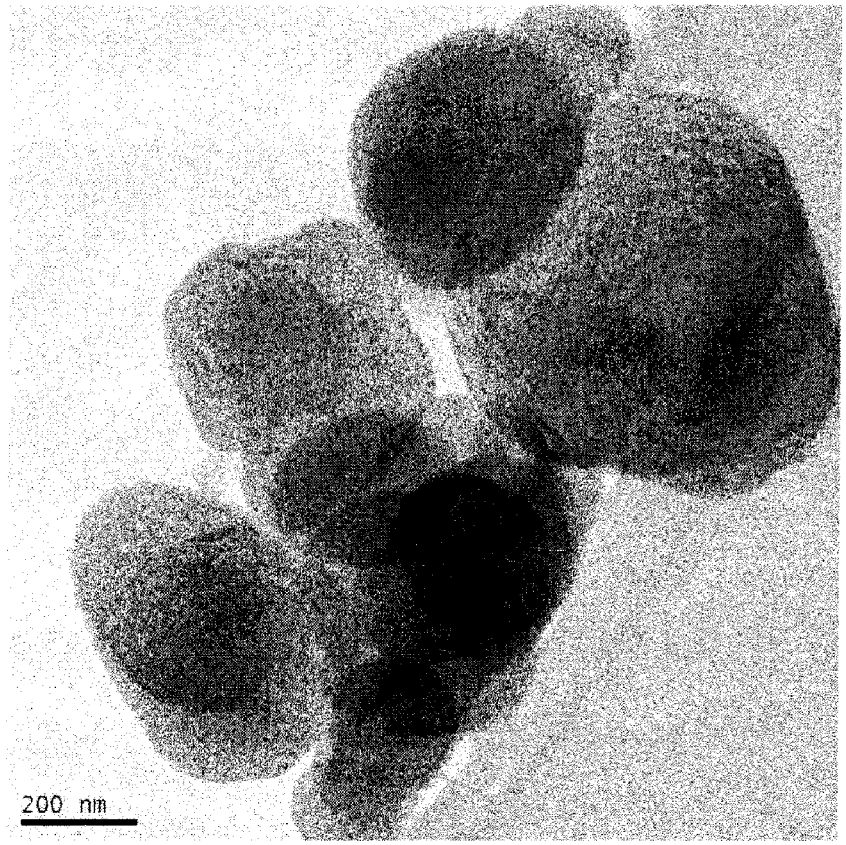
FIG. 5B is a TEM image corresponding to FIG. 5A showing nano-onions.

In contrast, ablation in comparable pressures of Ar leads to the deposition of moss-like soot (FIG. 4A) that is found to be amorphous carbon as shown in the featureless SAED pattern (FIG. 4B). Additionally, pure graphite targets did not lead to any nanostructures in either Ar or $O_2$, but instead to a loosely packed amorphous carbon deposit in Ar and an adherent amorphous carbon film in $O_2$. It appears that $O_2$ plays a critical role in the formation of the nanostructures described herein together with the graphite cement employed in target preparation and/or the metal. The yield of nano-onions is enhanced when ablating a target composed only of graphite cement (FIGS. 5A and 5B) in 2 Torr $O_2$. The shell structure makes these nano-onions good candidates for trapping small molecules, and potentially for energy storage. Referring, by way of example to FIG. 5A, three-dimensional (3D) caged structures are provided by material deposited and can serve as an excellent catalyst, again by trapping or adsorbing molecules on surfaces or within the cage. Potential applications for the nanostructures described herein also include, but are not limited to, electrochemical applications (e.g. thin-film batteries and microbatteries) and nano-sensors (e.g., gas sensing, protein and DNA sensing).

Although the present invention has been described in terms of the example embodiments above, numerous modifications and/or additions to the above-described embodiments would be readily apparent to one skilled in the art. It is intended that the scope of the present invention extend to all such modifications and/or additions.

What is claimed is:

1. A method, comprising:
   employing a laser process in an oxygen-containing atmosphere at room temperature to provide a substrate with a carbonaceous coating that includes nested carbon structures.

2. The method of claim 1, wherein the substrate is insulating.

3. The method of claim 1, wherein the substrate is conductive.

4. The method of claim 1, wherein the substrate includes a polymer.

5. The method of claim 1, wherein the substrate includes Silicon (Si).

6. The method of claim 1, wherein the substrate includes glass.

7. The method of claim 1, wherein the substrate includes quartz.

8. The method of claim 1, wherein the substrate includes Indium Tin Oxide (ITO).

9. The method of claim 1, wherein the substrate includes metal.

10. The method of claim 1, wherein the substrate includes steel.

11. The method of claim 1, wherein the laser process includes laser ablation of a target facing the substrate.

12. The method of claim 11, wherein the target includes graphite.

13. The method of claim 11, wherein the target includes a graphite filled organic compound.

14. The method of claim 11, wherein the target includes graphite cement.

15. The method of claim 11, wherein the target includes metal-doped graphite.

16. The method of claim 11, wherein the target includes Ni-doped graphite.

17. The method of claim 11, wherein the target includes Ni-Co-doped graphite.

18. The method of claim 11, wherein employing the laser process includes using an excimer laser.

19. The method of claim 11, wherein employing the laser process includes using a KrF laser.

20. The method of claim 1, wherein the oxygen-containing atmosphere is at a pressure of approximately 0.1 Torr or greater.

21. The method of claim 1, wherein the oxygen-containing atmosphere is at a pressure of approximately 2 Torr.

22. The method of claim 1, wherein the carbonaceous coating is low friction.

23. The method of claim 1, wherein the nested carbon structures are onion-shaped.

24. The method of claim 1, wherein the nested carbon structures have outer diameters of approximately 100-200 nm.

25. The method of claim 1, wherein the nested carbon structures have outer diameters of approximately 200 nm.

26. The method of claim 1, wherein the nested carbon structures include substantially concentric layers.

27. The method of claim 1, wherein the nested carbon structures include five or more layers.

28. The method of claim 1, wherein the nested carbon structures each include layers formed about a core.

29. The method of claim 28, wherein the cores include fullerene.

30. A method, comprising:
imparting energy to a target in an oxygen-containing atmosphere at room temperature to provide a substrate facing the target with a carbonaceous coating that includes nested carbon structures.

31. The method of claim 30, wherein the target includes graphite.

32. The method of claim 30, wherein the target includes a graphite filled organic compound.

33. The method of claim 30, wherein the target includes graphite cement.

34. The method of claim 30, wherein the target includes metal-doped graphite.

35. The method of claim 30, wherein the target includes Ni-doped graphite.

36. The method of claim 30, wherein the target includes Ni-Co-doped graphite.

37. The method of claim 30, wherein the substrate is insulating.

38. The method of claim 30, wherein the substrate is conductive.

39. The method of claim 30, wherein the substrate includes a polymer.

40. The method of claim 30, wherein the substrate includes Silicon (Si).

41. The method of claim 30, wherein the substrate includes glass.

42. The method of claim 30, wherein the substrate includes quartz.

43. The method of claim 30, wherein the substrate includes Indium Tin Oxide (ITO).

44. The method of claim 30, wherein the substrate includes metal.

45. The method of claim 30, wherein the substrate includes steel.

46. The method of claim 30, wherein imparting energy includes using a laser to ablate the target.

47. The method of claim 30, wherein imparting energy includes using an excimer laser to ablate the target.

48. The method of claim 30, wherein imparting energy includes using a KrF laser to ablate the target.

49. The method of claim 30, wherein the oxygen-containing atmosphere is at a pressure of approximately 0.1 Torr or greater.

50. The method of claim 30, wherein the oxygen-containing atmosphere is at a pressure of approximately 2 Torr.

51. The method of claim 30, wherein the coating is low friction.

52. The method of claim 30, wherein the nested carbon structures are onion-shaped.

53. The method of claim 30, wherein the nested carbon structures have outer diameters of approximately 100-200 nm.

54. The method of claim 30, wherein the nested carbon structures have outer diameters of approximately 200 nm.

55. The method of claim 30, wherein the nested carbon structures include substantially concentric layers.

56. The method of claim 30, wherein the nested carbon structures include five or more layers.

57. The method of claim 30, wherein the nested carbon structures each include layers formed about a core.

58. The method of claim 57, wherein the cores include fullerene.

* * * * *